United States Patent
Butler et al.

(10) Patent No.: US 8,659,211 B1
(45) Date of Patent: *Feb. 25, 2014

(54) QUAD AND DUAL CANTILEVER TRANSDUCTION APPARATUS

(71) Applicants: John L. Butler, Cohasset, MA (US); Alexander L. Butler, Weymouth, MA (US)

(72) Inventors: John L. Butler, Cohasset, MA (US); Alexander L. Butler, Weymouth, MA (US)

(73) Assignee: Image Acoustics, Inc., Cohasset, MA (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/853,329

(22) Filed: Mar. 29, 2013

Related U.S. Application Data

(63) Continuation-in-part of application No. 13/626,138, filed on Sep. 25, 2012, now Pat. No. 8,552,625.

(60) Provisional application No. 61/539,018, filed on Sep. 26, 2011.

(51) Int. Cl.
*H01L 41/04* (2006.01)
*B06B 1/06* (2006.01)
*H01L 41/08* (2006.01)

(52) U.S. Cl.
CPC .. *B06B 1/06* (2013.01); *H01L 41/08* (2013.01)
USPC .............................. 310/332; 310/370; 367/155

(58) Field of Classification Search
CPC ................................ B06B 1/06; B06B 1/0603
USPC ..................... 310/370, 330–332, 337, 323.21; 367/155, 157–58, 162–165, 176
See application file for complete search history.

(56) References Cited

U.S. PATENT DOCUMENTS

| | | | |
|---|---|---|---|
| 3,370,187 A * | 2/1968 | Straube | 310/330 |
| 4,140,936 A * | 2/1979 | Bullock | 310/328 |
| 4,332,986 A | 6/1982 | Butler | |
| 4,349,762 A * | 9/1982 | Kitamura et al. | 310/332 |
| 4,742,499 A | 5/1988 | Butler | |
| 4,754,441 A | 6/1988 | Butler | |
| 4,833,659 A * | 5/1989 | Geil et al. | 367/155 |
| 4,845,688 A | 7/1989 | Butler | |
| 4,864,548 A | 9/1989 | Butler | |
| 5,047,683 A | 9/1991 | Butler et al. | |
| 5,184,332 A | 2/1993 | Butler | |
| 5,632,841 A * | 5/1997 | Hellbaum et al. | 156/245 |
| 5,875,154 A | 2/1999 | Dechico | |
| 6,125,701 A * | 10/2000 | Sugitani et al. | 73/504.16 |
| 6,158,280 A * | 12/2000 | Nonomura et al. | 73/504.04 |
| 6,177,756 B1 | 1/2001 | Yachi et al. | |

(Continued)

OTHER PUBLICATIONS

L. Butler, A. L. Butler and J. A. Rice, "A tri-modal directional transducer," J. Acoust. Soc. Am. 115, 658-665 (Feb. 2004).

(Continued)

*Primary Examiner* — J. San Martin
(74) *Attorney, Agent, or Firm* — David M. Driscoll, Esq.

(57) ABSTRACT

An electro-mechanical transducer is disclosed, which provides a very low frequency wide band response from a bender (or benders) using piezoelectric cantilevers or center mounted free edge disc, providing additive output between the resonant frequencies achieving this response at great depths under equivalent free flooded conditions with additionally improved response with silicone rubber to reduce the acoustic cancellation associated with the dipole mode of vibration of the bender.

24 Claims, 17 Drawing Sheets

(56) References Cited

U.S. PATENT DOCUMENTS

| | | | |
|---|---|---|---|
| 6,389,897 B1* | 5/2002 | Tani et al. | 73/504.12 |
| 6,490,925 B2 | 12/2002 | Inoue et al. | |
| 6,553,835 B1* | 4/2003 | Hobbs et al. | 73/514.16 |
| 6,734,604 B2 | 5/2004 | Butler et al. | |
| 6,768,702 B2* | 7/2004 | Brown et al. | 367/151 |
| 6,820,966 B1 | 11/2004 | Drury et al. | |
| 6,950,373 B2 | 9/2005 | Butler et al. | |
| 7,168,289 B2 | 1/2007 | Kikuchi | |
| 7,292,503 B2 | 11/2007 | Butler et al. | |
| 7,372,776 B2 | 5/2008 | Butler et al. | |
| 7,401,517 B2 | 7/2008 | Pan et al. | |
| 7,453,186 B1 | 11/2008 | Butler et al. | |
| 7,528,533 B2* | 5/2009 | Ochi et al. | 310/370 |
| 7,692,363 B2 | 4/2010 | Butler et al. | |
| 8,354,778 B2* | 1/2013 | Arnold et al. | 310/370 |
| 8,421,304 B2* | 4/2013 | Hino et al. | 310/300 |
| 2006/0162447 A1 | 7/2006 | Ogura | |
| 2008/0149832 A1* | 6/2008 | Zorn | 250/311 |
| 2011/0271760 A1 | 11/2011 | Ohkoshi et al. | |
| 2012/0103093 A1 | 5/2012 | Yanagisawa et al. | |
| 2012/0132002 A1 | 5/2012 | Dube et al. | |
| 2012/0326571 A1 | 12/2012 | Shimura et al. | |
| 2013/0093287 A1* | 4/2013 | Biso et al. | 310/330 |

OTHER PUBLICATIONS

J. L. Butler, A. L. Butler and S. C. Butler, The modal Projector, J. Acoust. Soc. Am. 129, 1881-1889 (Apr. 2011).

L. Butler and J. L. Butler, "The octoid modal vector projector," (A) J. Acoust. Soc. Am., 130, 2505 (Oct. 2011).

* cited by examiner

Side View    Front View

QUAD AND DUAL CANTILEVER TRANSDUCTION APPARATUS

RELATED CASES

This application is a continuation-in-part of application Ser. No. 13/626,138, filed on Sep. 25, 2012. Priority for this application is hereby claimed under 35 U.S.C. §119(e) to commonly owned and co-pending U.S. Provisional Patent Application No. 61/539,018 which was filed on Sep. 26, 2011 and which are both hereby incorporated by reference herein in their entirety.

GOVERNMENT RIGHTS

The present invention was made, in part, with Government support under a Government contract. The Government may have certain rights in the invention.

BACKGROUND OF THE INVENTION

1. Field of the Invention

The present invention relates in general to transducers, and more particularly to underwater acoustic transducers. The present invention also relates to a transducer capable of radiating acoustic energy over a wide band of frequencies including very low frequencies and at deep depths. More particularly, the present invention relates to a multiply-resonant, piezoelectric-cantilever-type transducer mounted from a common stiff central rigid structure with the transducer operating in the bending mode and means for reducing dipole radiation cancellation effects.

2. Background Discussion

Low frequency underwater sound transducers require a large volume and compliant structure to obtain a low resonant frequency, such as 10 Hz, along with a high output level. This can be difficult to accomplish within a fixed volume at very low frequencies, even at shallow depths, and it becomes extremely challenging at deep depths where the hydrostatic pressure is high. That condition, coupled with a wide bandwidth, can be achieved with the present invention, which uses a fluid filled transducer of at least two cantilevers or one center mounted free edge disc with a common support structure. The disclosed "quad" cantilever resonant structure is similar to back-to-back tuning forks without stems providing one of the lowest flexural resonances for a given length and, because of the excitation of only the odd modes; there are no deep nulls between the modes of vibration providing a wide band response. Moreover, in accordance with the present invention the performance may be significantly improved by increasing the separation between opposite benders and replacing most of the enclosed fluid with silicone rubber. The silicone rubber may also be positioned and supported behind a dual cantilever bender pair or a single bender disc and provide significantly better performance than if replaced with a fluid such as water or the medium in which it is immersed. Although other materials such as cork with imbedded rubber or possibly paper may be considered, their compliant properties can be significantly compromised under pressure or as in the case of paper, be too stiff to cause an impedance miss-match between the bender and the fluid medium, typically water.

SUMMARY OF THE INVENTION

To accomplish the foregoing and other objects, features and advantages of the invention there is provided an improved electro-mechanical transduction apparatus that employs a symmetrical system that excites only odd bending modes, providing additive output between the successive resonant frequencies, yielding a very wide band response from very low frequencies to high frequencies, without nulls between the resonances. The device is comprised of piezoelectric cantilevers or a center mounted disc structure, driven with opposite phase on opposite sides, creating bending motion, and mounted and driven from a common stiff base along with silicone rubber for improved performance.

In accordance with the invention there is provided an electro-mechanical transduction apparatus that employs at least two electro-mechanical cantilever benders or at least a single bender disc attached to a common central stiff mounting structure with the option of silicone rubber for significant improved performance. In its most basic form, two of the cantilevers are mounted in the same plane on one side of the mounting structure with the free ends of the cantilevers on the opposite ends, and the other two cantilevers are mounted on the opposite side of the mounting structure. This quad arrangement may be used to form an array of these transducers by stacking additional quad units on the remaining surfaces of the support structure. Stiff plates can also be mounted on the remaining surfaces to reduce the out-of-phase cancellation of the interior and exterior radiation from the cantilever tines, leaving only acoustic radiation from the free open end of the interior cavity. Operation is in the free flooded mode with optional contained interior compliant fluid or compliant silicone rubber for improved low frequency performance and allowing operation at deep ocean depths. The quad structure may also be replaced with a pair of benders or a center mounted bender disc.

For shallow water operation where the hydrostatic pressure is not as great, the open ends can be blocked and the interior filled with a gas or air for greater output. Air backing can also be used under greater depths by filling the interior with compressed air. A compliant fluid or structure could also be used for greater depths. Greater output from a single structure can be obtained by adding four or more cantilever tines on the two remaining surfaces of the mounting structure with the interior filled with gas, fluid or compliant mechanical structure such as silicone rubber.

Although the invention described serves as a means for obtaining a significant very low frequency wide band underwater acoustic response, it could also be used in air as a source of sound. The structure could also serve as a receiver of sound or vibration, such as a microphone, hydrophone or accelerometer.

In accordance with one embodiment of the present invention there is provided an electro-mechanical transduction apparatus that comprises: symmetrically mounted piezoelectric driven cantilever tines with the greatest motion at its ends, along with means to reduce acoustic dipole cancellation, achieving very low frequency acoustic response because of the cantilever resonance operation and achieving wideband performance because of odd mode excitation yielding additive output between modes. The reduced dipole cancellation is achieved by altering the acoustic impedance behind the benders.

In accordance with other aspects of the present invention there is provided the means for stacking these bender elements to form an array of elements. There is also means provided for operation with a free flooding or contained fluid within the interior cavity of the cantilever structure and means for increasing the interior compliance. In addition to this there is also provided a means for replacing the piezoelectric tines in one plane with passive non-piezoelectric tines, such as steel or aluminum, yielding a response similar to the all piezoelectric response. Silicone rubber may be used to improve the output performance response by increasing the interior compliance, and also by extending the low frequency performance though an additional lower frequency resonance.

BRIEF DESCRIPTION OF THE DRAWINGS

Numerous other objects, features and advantages of the invention should now become apparent upon a reading of the following detailed description taken in conjunction with the accompanying drawings, in which.

DETAILED DESCRIPTION

In accordance with the present invention, there is now described a number of different embodiments for practicing the present invention. In the main aspect of the invention there is provided piezoelectric cantilevers mounted on a central support providing very low frequency and wide band response even at great ocean depths. The central rigid mount is important to this cantilever invention as it provides the rigid boundary conditions for the cantilever tines and because of the design symmetry, no additional masses or structures are needed for the cantilever central boundary condition on any of the tines in this quad configuration. (Additional mass is desired in the dual tine structure arrangement without the opposing dual tines.)

Figure 1:
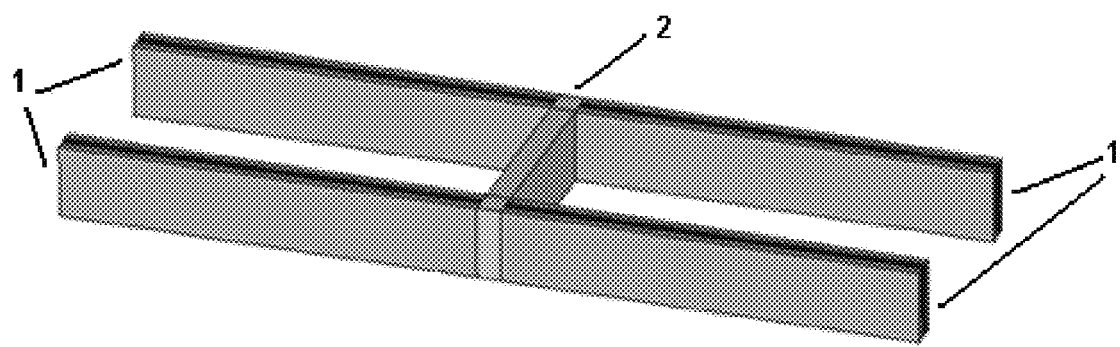
FIG. 1 schematically illustrates the quad cantilever transducer with four piezoelectric tines driven into the bending mode and mounted on a common base mounting structure.

A simplified picture of the quad cantilever acoustic transducer is illustrated in the four tine, 1, quad arrangement of FIG. 1. The similarity to back-to-back tuning forks, without stems, can be seen. When operated in the water there would be top and bottom plates attached to the rigid mount, 2, and mechanically isolated from the cantilever tines with water or other more compliant fluid or structure in the interior section. This free flooding would require a rubber boot and/or potting to electrically isolate the piezoelectric benders, 1, from the exterior water and interior water, which allows for pressure equalization and operation at great ocean depths. If the interior is to be filled with another fluid, a rubber enclosing bag or boot would be used to maintain the fluid within the interior. A major portion of the interior fluid could be replaced by silicone rubber for improved performance, and here, no end-plates would be necessary. Transducers could be stacked on top of each other and used together as an array to attain a greater source level.

Figure 2:
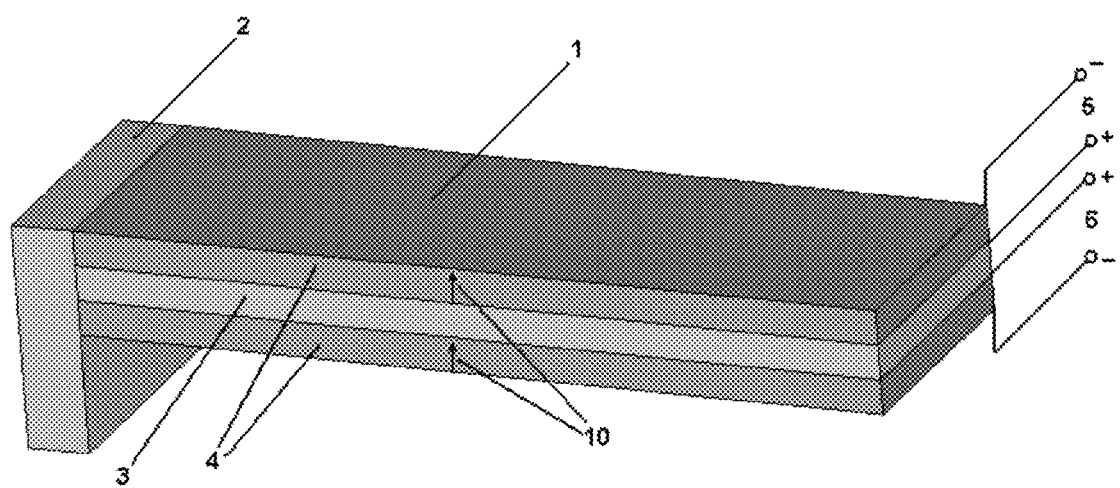
FIG. 2 schematically illustrates the electrical connections for piezoelectric 31 mode tri-laminar operation with two plates of piezoelectric material mounted on a central substrate wired for bending mode operation.

FIG. 2 schematically illustrates the wiring arrangement for the piezoelectric plates or bars, 1, driven by voltages, 5, and, 6, for operation in the piezoelectric 31 mode. Because of the polarization direction, 10, and the wired polarity shown as, 5, and, 6, the top and bottom piezoelectric plates, 4, of FIG. 2 are driven out of phase causing bending motion of the cantilever tine, 1, mounted on structural support base, 2. In this particular tri-laminar arrangement a central inactive substrate, 3, is used to obtain a higher electromechanical coupling coefficient.

Figure 3A:
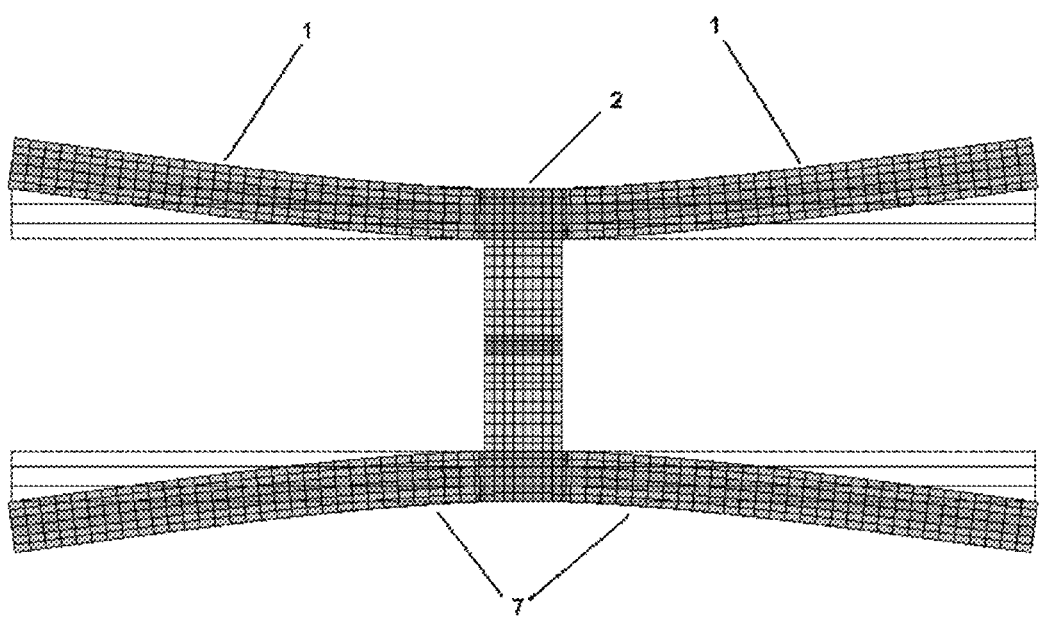
FIG. 3a schematically illustrates the motion of quad structure in a symmetric mode of vibration.
Figure 3B:
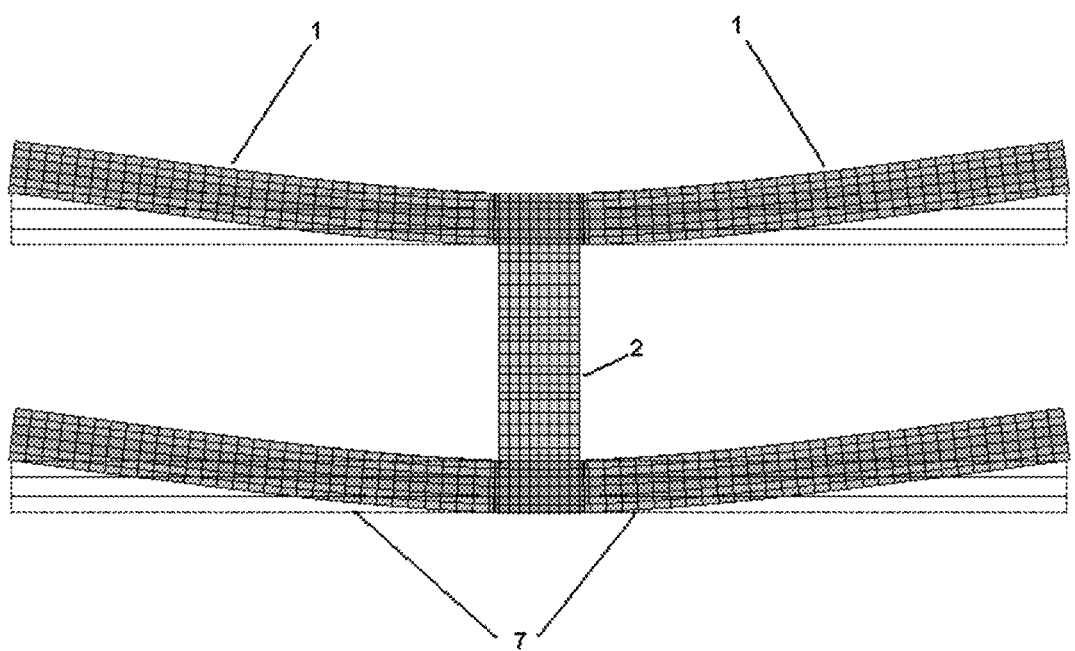
FIG. 3b schematically illustrates the motion of quad structure in an anti-symmetric mode of vibration.

FIG. 3a illustrates the motion of the cantilevers at the fundamental symmetric mode of vibration of a quad section. Here the two bottom tines, 7, are wired in the same way of the two top tines, 7, to create this symmetric vibration shown where the top two tines move in a direction opposite the bottom two tines. FIG. 3b illustrates the motion of the cantilevers at the fundamental anti-symmetric mode of vibration of a quad section. Here the two bottom tines, 7, are wired oppositely in phase from the top two tines creating all tine motions in the same direction with the center mount moving, 2, in the opposite direction of the four tines.

The cantilever is an ideal component for very low frequency wide band performance. The fundamental resonance, $f_r$, of a cantilever bender bar of length L and thickness t may be written as $f_r=0.1615ct/L^2$ where c is the bar sound speed in the material. The cantilever mode design has the advantage of achieving a low fundamental resonance frequency from a compact size. It has not only a size advantage, but a wideband response advantage with additive motion between the overtones. The odd quarter wavelength multiples of the overtones are not harmonically related and the first few are at $6.27f_r$ and $17.55f_r$. The cantilever is excited by reversing the phase or direction of polarization of the electric field on opposite sides of the piezoelectric cantilever bender tines. The center mounted free edge piezoelectric planar mode bender disc yields a similar response but with a larger diameter.

Figure 4:
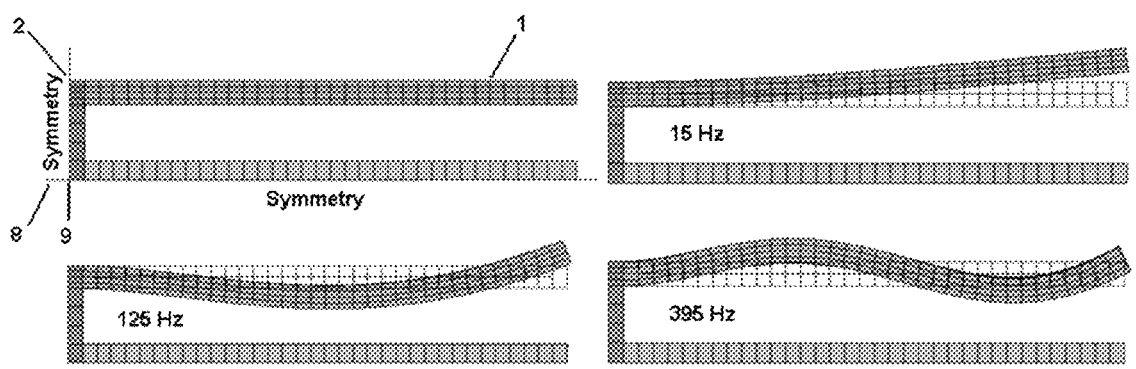
FIG. 4 illustrates the cantilever motion of the first three modes of vibration along with the initial case of no motion.

A finite element symmetry model of one tine, 1, of the cantilever quad design, with length approximately 30 inches, is shown in FIG. 4 mounted on the central rigid support, 2, with symmetry planes 8 and 9. The motion of the first three modes of cantilever vibration at 15, 125 and 395 Hz are illustrated in this figure. Although cantilever benders provide some of the lowest resonances for a given length, they are susceptible to excessive bending stress under deep operation and in these cases the design can benefit from pressure equalization.

Figure 5:
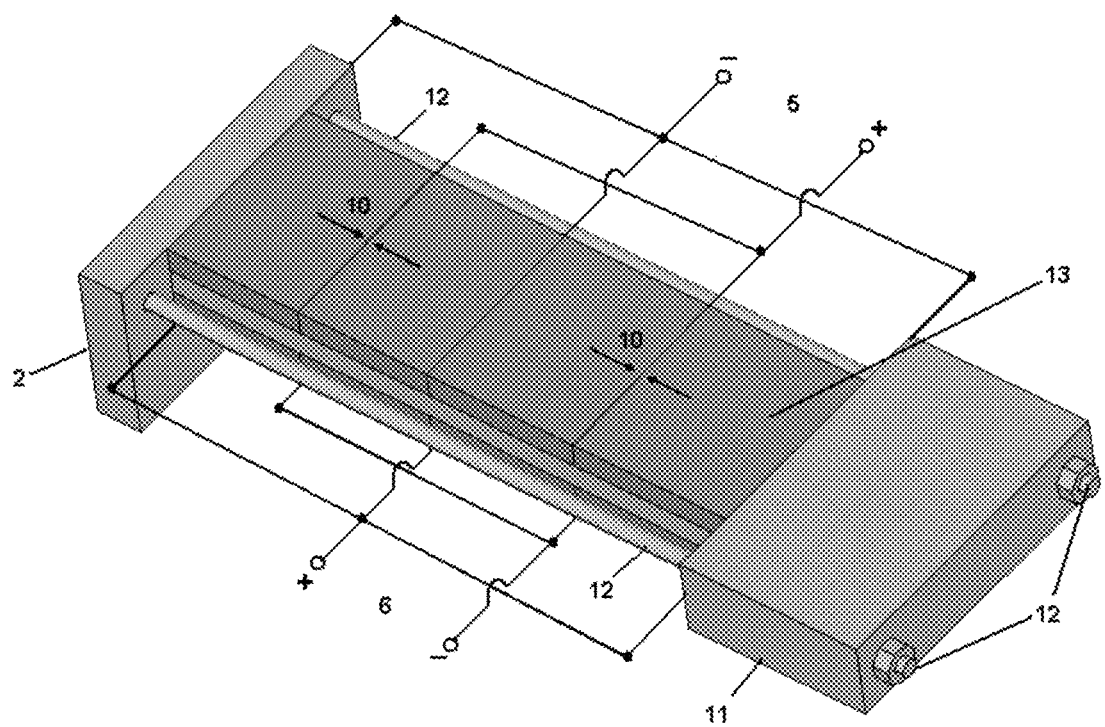
FIG. 5 illustrates a single cantilever of the quad structure with an end mass along with two compression rods and wired for piezoelectric operation in the 33 mode.

FIG. 5 illustrates schematically a 33 mode design which has approximately twice the coupling coefficient of the 31 mode design of FIG. 2. Here, for simplicity, FIG. 5 shows only four 33 mode piezoelectric plates, 13, with direction of polarization indicated by the arrows, 10. The top and bottom part of the plates, 13, are connected out of phase to excite the bending mode of this single cantilever tine of a quad unit as illustrated in FIG. 1. Also illustrated is the mass, 11, which replaces part of the piezoelectric structure of the cantilever. Use of steel, as item, 11, allows a reduction in cost, approximately the same fundamental resonance frequency and yet an improved coupling coefficient. This is possible since there is little bending at this free end of the cantilever, and a piezoelectric section here would only add electrical capacity but little bending motion. Two high strength tie rods, 12, are also provided to supply the needed compression on the piezoelectric material under high drive. Terminals, 5, and, 6, illustrate reversed phase operation between the upper and lower electrodes.

Figure 6:
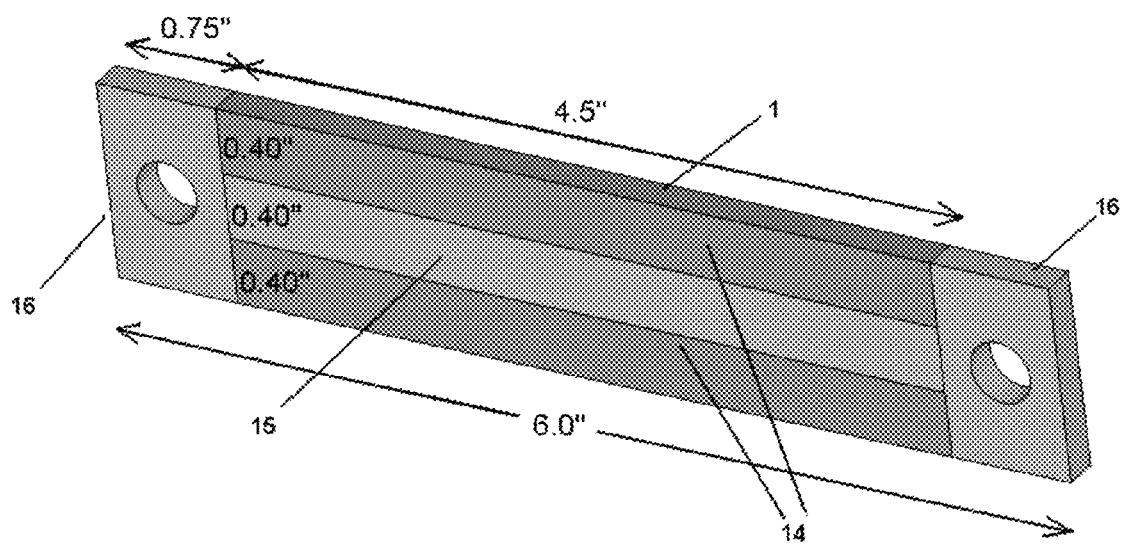
FIG. 6 illustrates a single piezoelectric element showing a margin separating the electrodes as well as two holes for two compression tie rods.

A larger number of thinner piezoelectric pieces, 13, of FIG. 5 would be used in actual practice allowing a lower voltage. One such piezoelectric piece is illustrated in FIG. 6 with electrode surfaces, 14, inactive substrate, 15, and end pieces, 16, with holes to accept the tie rods of FIG. 5. An alternative arrangement would be to extend electrode polarized piezoelectric material to the end of the end pieces or, eliminate the end pieces, 16, as illustrated in FIG. 5. In practice, the tines of the quad elements could be made in modular form, possibly 10 modules, each containing 14 PZT piezoelectric elements with bar thickness of possibly 0.20 inches.

FIG. 6 schematically illustrates a possible six inch height of each quad element of this sample design, which contains 4.5 inches of piezoelectric PZT-8, active piezoelectric material, sandwiched between two 0.75" plates of G-10 (or possibly PVC or a cast composition). Each of these plastic plates has holes large enough for high strength steel compression tie rods. These two tie rods provide the necessary compressive bias on the PZT piezoelectric material. A cross section of this arrangement is illustrated in FIG. 6 showing the PZT with the split electrodes, allowing oppositely phased voltages or reversed polarization for obtaining operation in the bending mode. This design is referred to as a 33 mode of operation as the electric field and useful displacements are in the same direction and parallel to the direction of polarization of the piezoelectric ceramic. This direction is perpendicular to the electrode surfaces and through the thickness of the bar. Alternatively, the two end pieces may also be piezoelectric with electrodes and margin of 0.40 inches and two holes for the tie rods, increasing the fully active size to, in this case, 6 inches.

Figure 7:
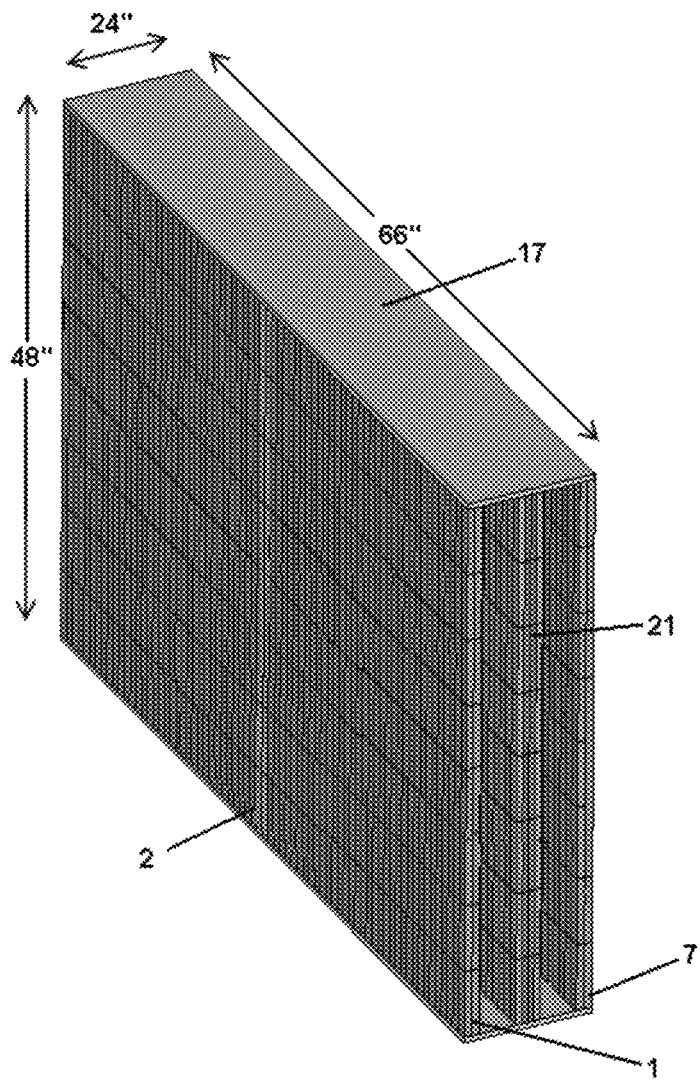
FIG. 7 illustrates an array of quad units along with stiff end plates.

A specific array of quad elements is illustrated in FIG. 7 and shows, approximately, an overall length of 60", thickness of 24" and 48" height for this particular transducer example. FIG. 7 also shows the central rigid mounting structure, 2, along with a central support, 21, which together with, 2, support the end plates, 17, on the top and bottom of the array. A significantly improved performance can be obtained by increasing the thickness of the full transducer, extending it from 24" to 48", and by filling most of the interior space with silicone rubber.

Figure 8A:
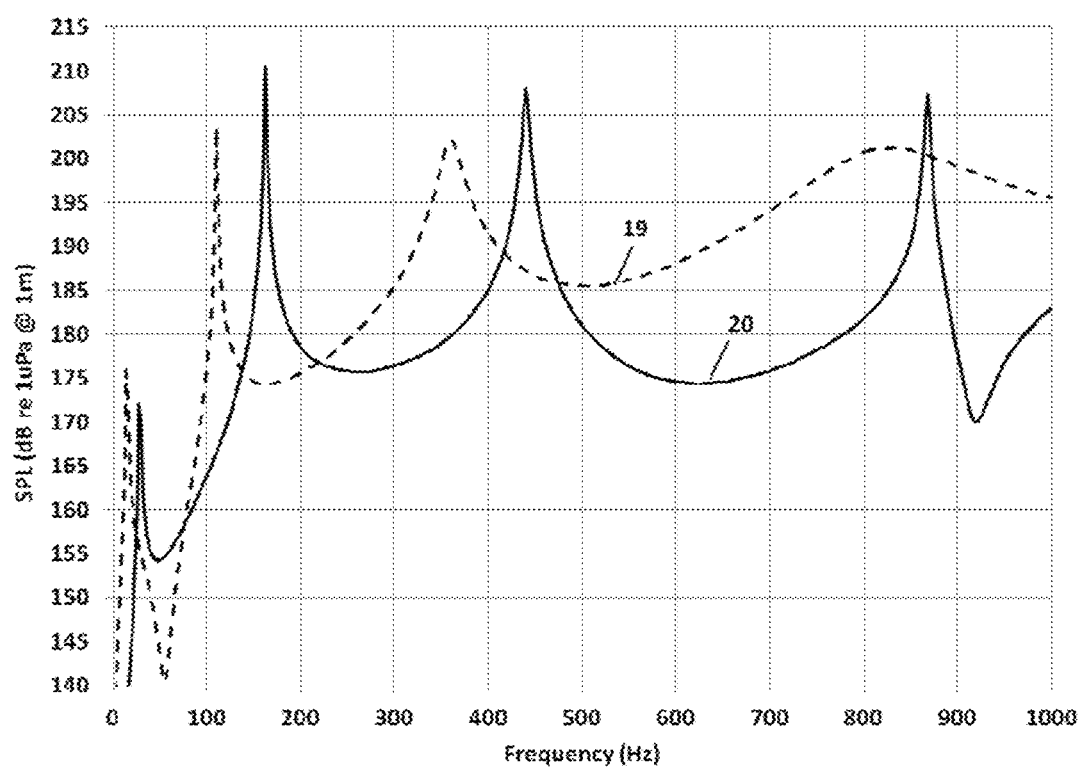
FIG. 8a shows the response of an array of quad units with stiff end plates operating in the symmetric, 19, and anti-symmetric mode, 20.
Figure 8B:
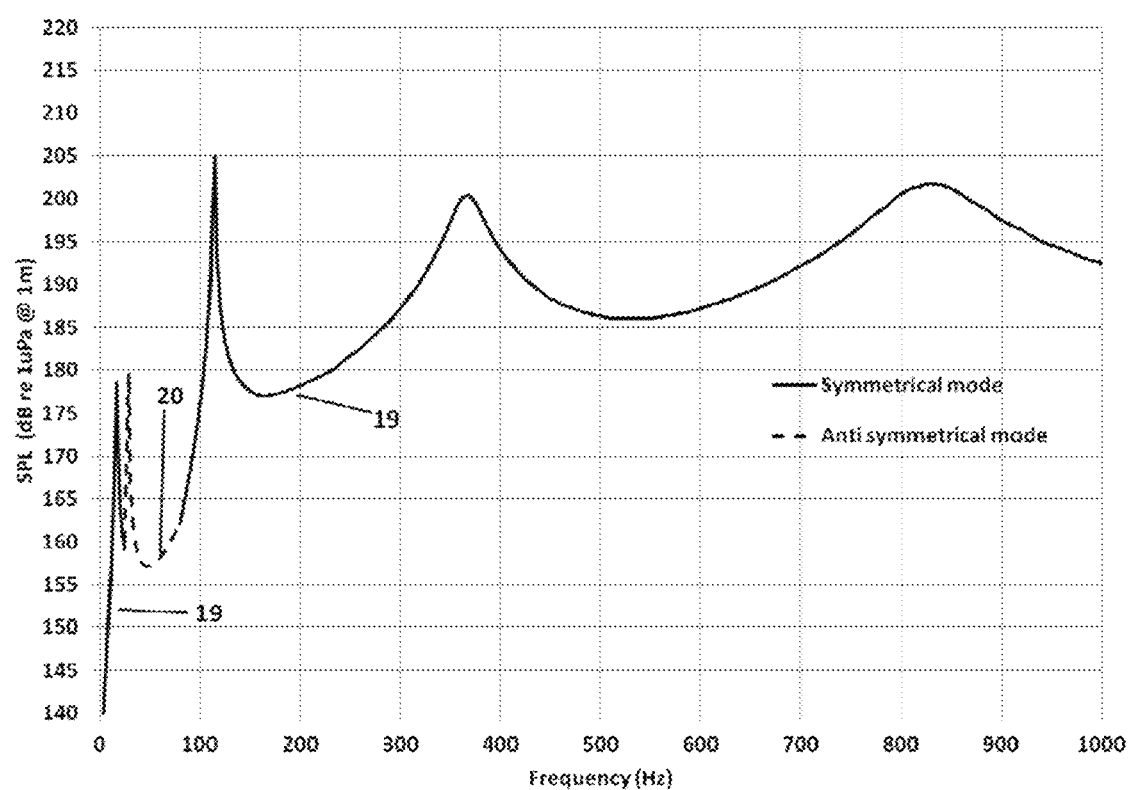
FIG. 8b shows the response of an array of quad units with stiff end plates operating in the symmetric mode, 19, spliced with the anti-symmetric mode, 20, response.
Figure 8C:
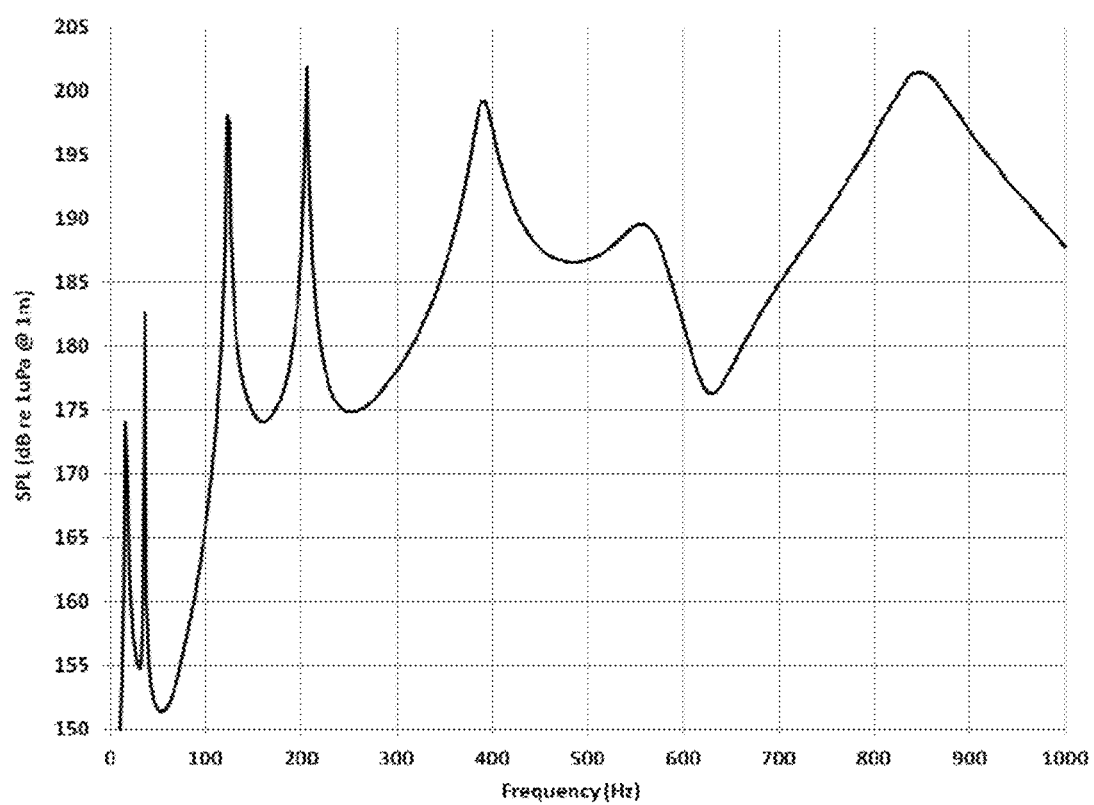
FIG. 8c shows the response of an array of quad units with stiff end plates operating with the back piezoelectric tine section replaced with a metal parasitic tine section.

The finite element calculated sound pressure level (SPL) response for the array of FIG. 7 with piezoelectric PZT pieces of FIG. 6 is shown in FIGS. 8a, 8b and 8c for a silicon oil partially filled condition for improved very low frequency response. The first three flexural cantilever resonances and additive wide band response are seen in FIG. 8a which shows the case for symmetric drive, 19, and anti-symmetric drive, 20. The greater reduction in the vicinity of 50 Hz of the symmetric drive, 19, condition can be improved by splicing in the response of the symmetric drive, 20, as illustrated in 8b. Direct synthesis of the motions driven at the same voltage amplitude illustrated in FIGS. 3a and 3b provide a condition where the bottom two tines, 7, cancel each other as if they were not driven at all. This condition can also be achieved by simply not driving the bottom two tines and replacing them with a passive material such as aluminum or steel, creating a passive parasitic radiating resonator. The response for this case, where only the tines, 1, are piezoelectric driven and the bottom tines, 7, are steel is illustrated in FIG. 8c.

Figure 9:
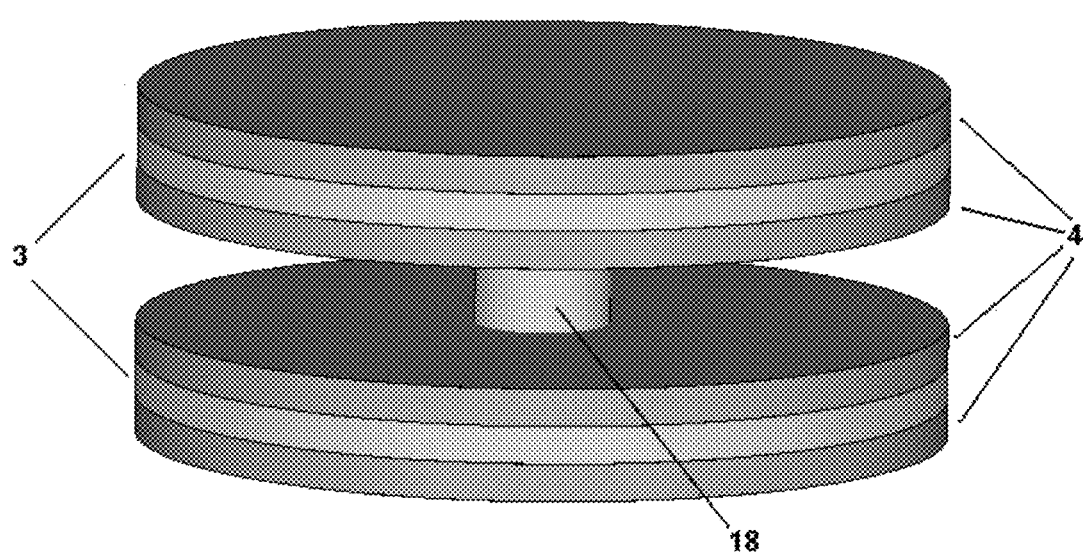
FIG. 9 schematically illustrates a center supported dual bender transducer composed of two tri-laminar piezoelectric drive circular plates or discs.
Figure 10:
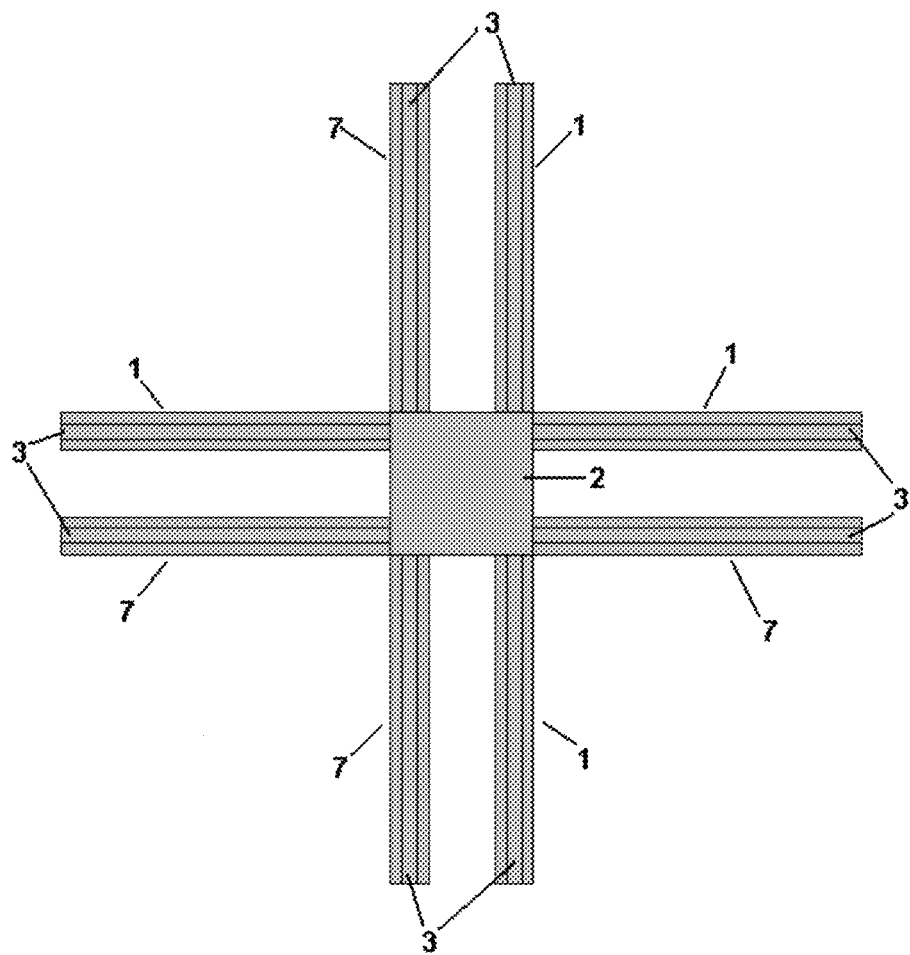
FIG. 10 schematically illustrates a center supported dual quad bender transducer composed of eight tri-laminar piezoelectric drive bender bars.
Figure 10A:
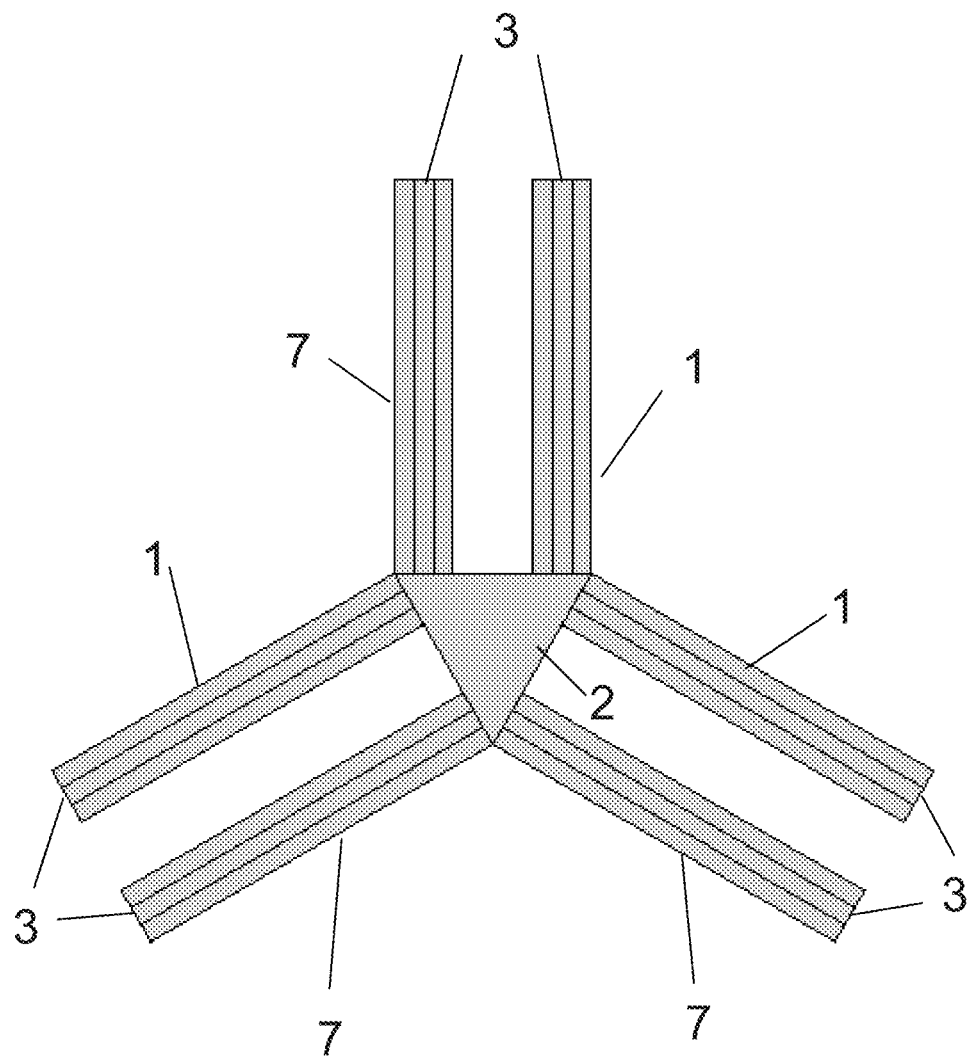
FIG. 10a schematically illustrates a center supported transducer of triangular form.

Although the focus of this teaching has been on cantilever bender bars, the same principles apply to a pair of flexural disc transducers with a center mount between the two, yielding a fundamental resonance frequency that is normally higher than the quad cantilever construction. This alternative disc configuration is schematically illustrated in FIG. 9 showing a center post, 18, tri-laminar planar-mode piezoelectric discs, 4, and substrates, 3. An additional alternative eight tine arrangement, instead of the four tine quad structure of FIG. 1, is illustrated in FIG. 10. This eight tine structure allows greater output from the piezoelectric tines, 1 and 7, with substrates, 3, and the square supporting stiff structure, 2, preferably steel. A structure composed of three tine pairs, 1, 7, of piezoelectric tines may be used with an equilateral triangular supporting structure instead of the square, 2, shown in FIG. 10. In this regard refer to FIG. 10a for an illustration of the triangular version.

Figure 11:
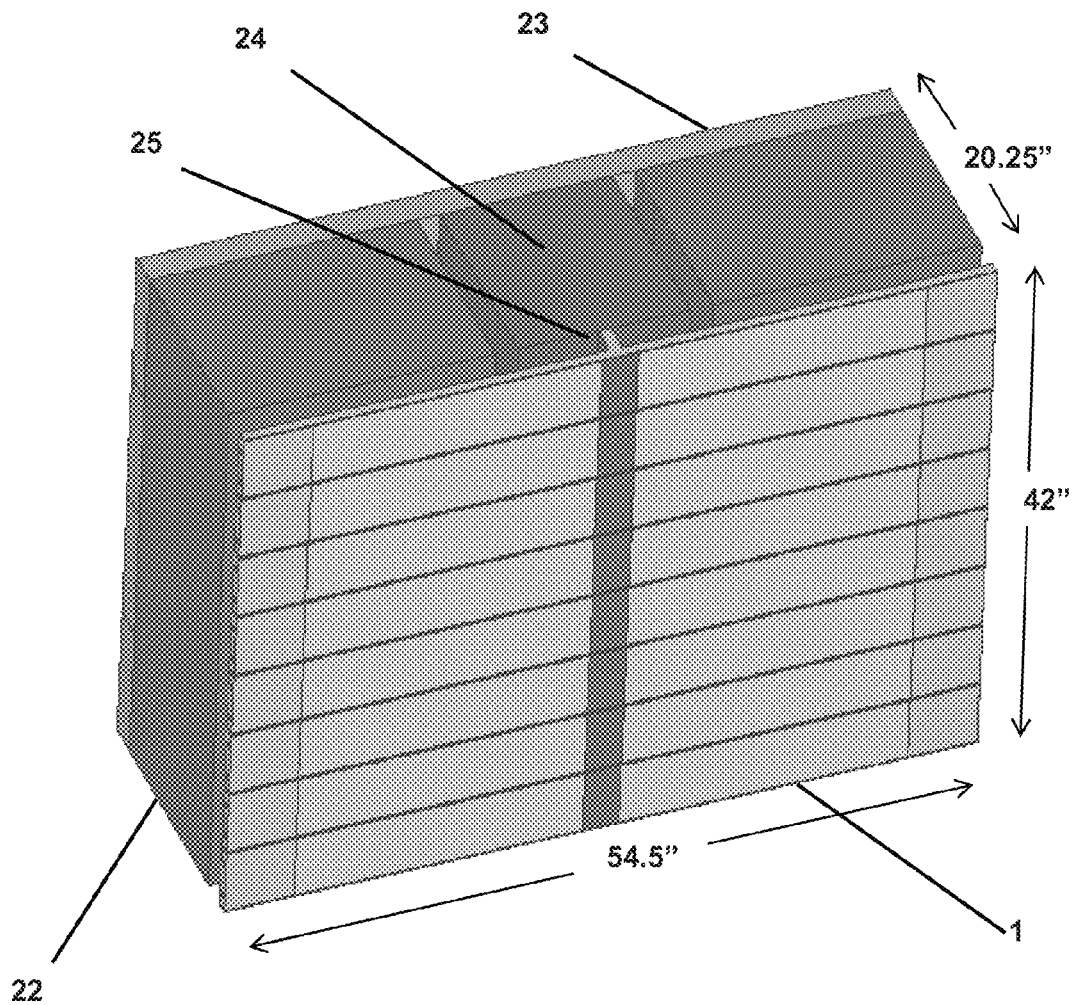
FIG. 11 schematically illustrates a dual bender array mounted on a stiff and massive central structure along with silicone rubber mounted on a backing plate.

The eight staved piezoelectric bender array shown in FIG. 11 has been constructed to utilize silicone rubber, 22, mounted on an aluminum back plate, 23, with the cantilever bender array 1 mounted on a steel center mass, 24. In the embodiment illustrated there are two separate silicon rubber blocks 22 one on either side of the center mass 24. The benders 1 are mounted through a steel stem, 25, which is mounted on the massive steel center mass 24 allowing each side (to the left and right in FIG. 11) of the bender to operate as cantilevers. The particular silicone rubber used in this illustration is designated as RTV 615 and has a very low Young's modulus of 1.5 MPa, Poisson's ratio of 0.48 and bulk modulus of 12.5 MPa which is almost 200 times less than the bulk modulus of water, which is approximately 2,200 MPa. (An alternative, but more expensive, silicone rubber is RTV 566 with a Young's modulus of 4.2 MPa, Poisson's ratio of 0.45 and bulk modulus of 14.0 MPa.) The term RTV stands for "room temperature vulcanized." This free flooded construction allows nearly a 20% reduction in size and yet yields an improved response shown in FIG. 12 as curve 25. This sound pressure level, SPL, response is seen to yield significantly more output when compared to the same transducer but without silicone rubber, represented as curve 26 in FIG. 12.

Figure 12:
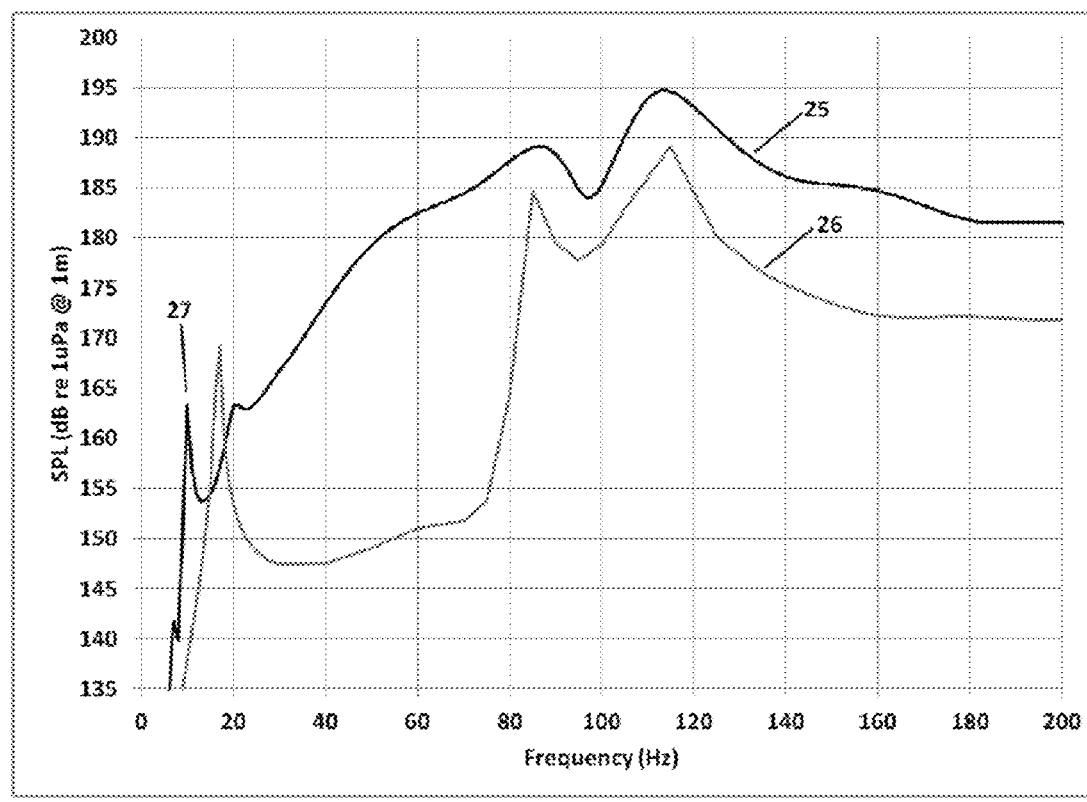
FIG. 12 shows the in-water sound pressure level response (SPL) of the rectangular transducer array of FIG. 11 with and without silicone rubber backing FIG. 13 schematically illustrates a center supported axisymmetric bender transducer composed of a tri-laminar piezoelectric drive circular plate with silicone rubber mounted on a circular backing plate.

Although not shown, the silicone rubber backed response, 25, yields a nearly omni-directional beam pattern, while response curve 26 without the silicone rubber yields a nearly dipole figure eight type beam pattern with lower radiation efficiency (Refer to FIG. 12). The silicone rubber on the back side causes a miss-match with the water impedance on the front side of the array, significantly reducing the out-of-phase back radiation now allowing nearly omni-directional single-sided-radiation. This is accomplished with a more efficient higher-sound-pressure level compared to what would be obtained from the lower level dipole radiation without the silicone rubber. The higher radiation load of the nearly omni-directional radiator can be seen through the more damped resonance of curve 25 in the vicinity of 100 and 20 Hz. In addition to this, the low frequency response is extended by nearly an octave as a result of the resonance at 10 Hz. This resonance, 27, approximates the performance of a low frequency Helmholtz type radiator through the dynamic mass of the water column behind the benders (along with the port radiation mass) and high compliance of the silicone rubber.

Figure 13:
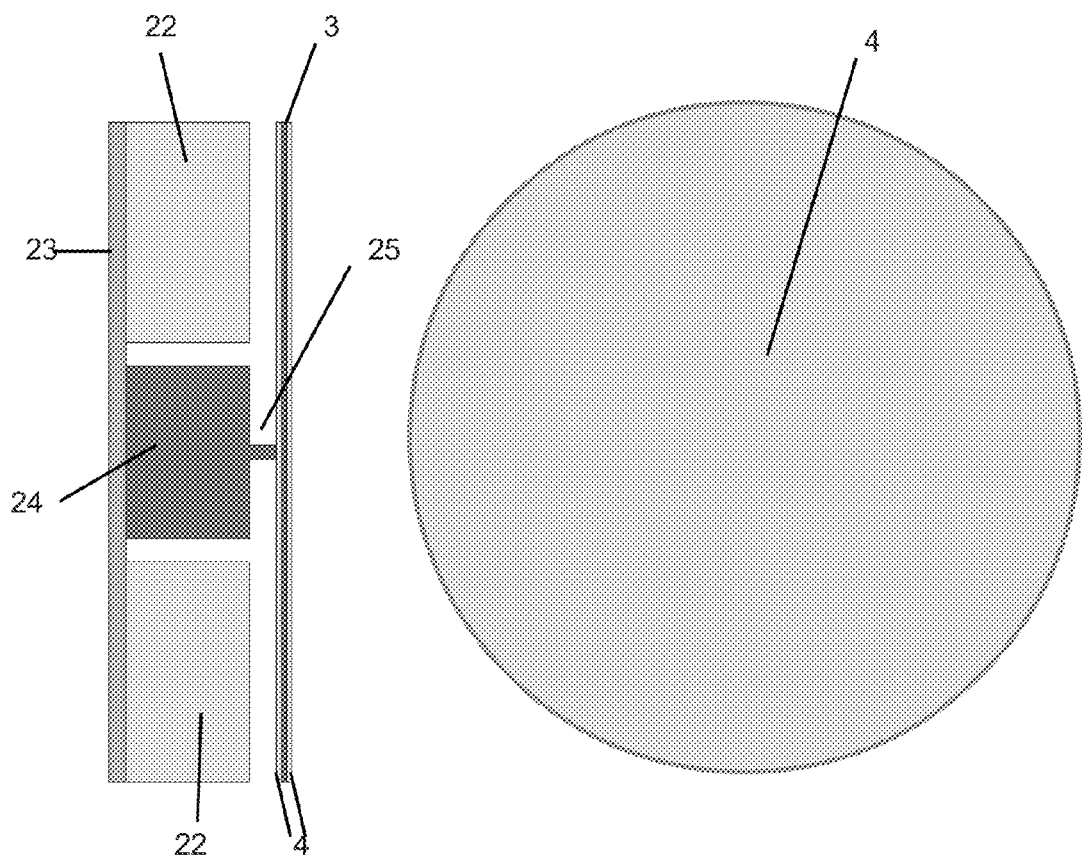

An axi-symmetric version of the rectangular transducer array of FIG. 11 is shown in FIG. 13. As in the case of FIG. 9, it is a tri-laminar piezoelectric bender and is composed of piezoelectric discs, 4, operating in the planar mode along with an inert substrate, 3. As in FIG. 11, the steel stem mount 25 is disposed between the bender 3, 4 and the steel counter mass, 24. The aluminum backing plate 23 is mounted (secured) to the steel center mass, 24, and the annular silicone rubber 22 is mounted (secured) to the aluminum backing plate, 23. This transducer operates the same as the rectangular transducer of FIG. 11 but when scaled to a smaller size may be used as a simpler piston transducer which could be implemented as an array of these transducers. A one 10th scaled size axi-symmetric piston transducer response would be similar to curve 25 of FIG. 12 but with a frequency scale of 0 to 2,000 Hz and a reduced sound pressure level (SPL). Here the piston diameter would be approximately 5.4" and the depth would be only 2 inches making this a low-frequency, very low-profile transducer that could operate at significant depth. Greater source level and directionality would be obtained from an array of these transducers.

The above principles of this invention may be applied to transducers which transmit or receive acoustic waves or in a fluid or gas. The principles can also be applied to accelerometers. Moreover, the electromechanical material may be single crystal material, piezoelectric ceramic, electrostrictive, magnetostrictive or electromagnetic. Although steel, aluminum and silicone rubber RTV 615 were used in the illustrations other appropriate specific materials may be used. The piezoelectric transducer has been discussed as a trilaminar design with an inert section sandwiched between two piezoelectric sections. An alternative less expensive, but less powerful, arrangement would use a bilaminar structure with one inert layer and one active layer of piezoelectric material.

LIST OF REFERENCE NUMBERS

1. Top piezoelectric tines
2. Central rigid mount
3. Inactive substrate
4. Piezoelectric element
5. Electrodes
6. Electrodes
7. Bottom piezoelectric tines
8. Symmetry plane
9. Symmetry plane
10. Polarization arrow
11. Tine end mass
12. Tie rod
13. Piezoelectric section
14. Electrode surface
15. Margin between electrodes
16. End piece
17. End plate
18. Center support rod
19. Symmetric response
20. Anti-symmetric response
21. End plate support beam
22. Silicone rubber
23. Back plate
24. Center mass
25. Stem

Having now described a limited number of embodiments of the present invention, it should now become apparent to those skilled in the art that numerous other embodiments and modifications thereof are contemplated as falling within the scope of the present invention, as defined in the appended claims.

What is claimed is:

1. A piezoelectric free-flooded bilaminar or trilaminar bender transducer comprised of a piezoelectric bender array, a stiff mass and a compliant RTV silicone rubber mass to create a difference in impedance between front and back sides of the bender array reducing the cancelling between the two radiating sides and providing greater output with a more omni-directional rather than dipole radiation pattern.

2. The piezoelectric cantilever bender transducer of claim 1 including a support stem, a backing plate, and at least a pair of dual in-line cantilevers mounted on the stem connected to the stiff mass that also is for supporting the back plate on which silicone rubber is mounted and directed toward the benders.

3. The piezoelectric bender disc transducer of claim 1 including a stem connected to the mass and a back plate on which is mounted the compliant RTV silicone rubber mass and directed toward the bender.

4. The piezoelectric bender transducer of claim 1 including an additional low frequency Helmholtz type resonator formed from the dynamic mass of the water column behind the benders and the compliance of the silicone rubber.

5. A cantilever bender transducer with a minimum of four electromechanically active bending beam tines each having inner and outer tine ends and opposed sides, a center support member, the inner ends of respective tines commonly supported at a the center support member, one pair of tines connected to the center support member and the other pair of tines, also connected to the center support member but extending in the opposite direction to the one pair of tines, and with at least two of the bending beam tines being activated, each said at least two active tines comprised of an inactive substrate and opposed piezoelectric plates forming the opposed sides and integrally formed with said inactive substrate, said inactive substrate and piezoelectric plates being coterminous so that the inactive substrate and opposed piezoelectric plates bend together when excited, a voltage source for driving said active tines, and a rubber mass that is disposed adjacent to said tines.

6. The cantilever bender transducer of claim 5 with an end mass connected to at least one tine and providing an improved coupling coefficient.

7. The cantilever bender transducer of claim 5 further including two tie rods for compression of the piezoelectric material.

8. The cantilever bender transducer of claim 5 wherein the rubber mass comprises a silicone RTV mass.

9. The cantilever bender transducer of claim 5 wherein the transducer is free flooded with one of water and an interior gas or oil backing, and excited by ceramic or single crystal piezoelectric or electrostrictive material with separated electrodes for excitation of opposite phased bending motion operating in the 33 or 31 mode.

10. The cantilever bender transducer of claim 5 operating in one of a symmetric mode and an anti-symmetric mode.

11. The cantilever bender transducer of claim 10 including one of operating in the symmetric mode over part of the frequency band and operating in the anti-symmetric mode over the remaining part of the frequency band, and operating simultaneously in the symmetric and anti-symmetric modes.

12. The cantilever bender transducer of claim 5 electro mechanically driven with, piezoelectric ceramic, single crystal material, electrostrictive, magnetostrictive variable reluctance, or magnetic materials or principles.

13. A cantilever tri-laminar bender transducer with two electro-mechanically bending circular or square plates, a center support post having opposed ends for respectively supporting the two circular or square plate, each said plates comprised of an inactive substrate and opposed piezoelectric plates forming the opposed sides and integrally formed with said inactive substrate, said inactive substrate and piezoelectric plates being coterminous so that the inactive substrate and opposed piezoelectric plates bend together when excited, a voltage source for driving said plates in a planar bending mode through phase reversed excitation, and a rubber mass that is disposed adjacent to said plates.

14. The cantilever bender transducer of claim 13 wherein said rubber mass comprises a silicone RTV mass.

15. A cantilever bender transducer comprising:
a plurality of electromechanically active bending beam tines each having inner and outer tine ends and opposed sides;
a center support member having opposed one and other sides;
the inner ends of respective tines commonly supported at the center support member;
one pair of tines of the plurality connected to the one side of the center support member and the other pair of tines of the plurality connected to the other side of the center support member and extending in the opposite direction to the one pair of tines;
each tine comprised of an inactive substrate and opposed piezoelectric plates forming the opposed sides and integrally formed with said inactive substrate, said inactive substrate and piezoelectric plates being coterminous so that the inactive substrate and opposed piezoelectric plates bend together when excited;
a voltage source for driving said tines; and
a rubber mass that is disposed adjacent to said tines.

16. The cantilever bender transducer of claim 15 wherein said rubber mass comprises a silicone RTV mass.

17. The cantilever bender transducer of claim 15 including an end mass connected to at least one tine and providing an improved coupling coefficient.

18. A cantilever bender transducer comprising:
at least one electro-mechanical bender member;
a mounting plate;
a center mass;
a stem member for connecting the at least one electro-mechanical bender member with the center mass;
at least one rubber mass mounted from said mounting plate and disposed adjacent to said center mass; and
a voltage source for driving said bender member.

19. The cantilever bender transducer of claim 18 wherein the bender member is mounted by the stem member so as to be cantilevered therefrom.

20. The cantilever bender transducer of claim 18 wherein the center mass is secured to the mounting plate.

21. The cantilever bender transducer of claim 20 including a pair of separate rubber masses mounted to the backing plate and disposed on opposed sides of the center mass.

22. The cantilever bender transducer of claim 18 wherein the at least one bender member is round or square shaped.

23. The cantilever bender transducer of claim 18 wherein said rubber mass comprises a silicone RTV mass.

24. The cantilever bender transducer of claim 18 including a stack of electro-mechanical bender members.

* * * * *